United States Patent
Li (10) Patent No.: US 7,109,801 B2
(45) Date of Patent: Sep. 19, 2006

(54) LOW GATE OXIDE STRESS POWER AMPLIFIER

(75) Inventor: Qiang (Thomas) Li, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/069,657

(22) Filed: Mar. 1, 2005

(65) Prior Publication Data

US 2005/0168288 A1 Aug. 4, 2005

Related U.S. Application Data

(63) Continuation of application No. 10/683,183, filed on Oct. 10, 2003, now Pat. No. 6,888,410.

(51) Int. Cl.
*H03F 1/52* (2006.01)
*H03F 3/45* (2006.01)

(52) U.S. Cl. ............... 330/298; 330/253; 330/277; 330/311

(58) Field of Classification Search ............. None
See application file for complete search history.

(56) References Cited

U.S. PATENT DOCUMENTS 6,636,114 B1 * 10/2003 Tsutsui et al. ............ 330/51
6,667,657 B1 * 12/2003 Nakatani et al. .......... 330/51

* cited by examiner

*Primary Examiner*—Khanh Van Nguyen
(74) *Attorney, Agent, or Firm*—Garlick Harrison & Markison; Timothy W. Markison (57) ABSTRACT

A power amplifier includes an input transistor, an output transistor, and circuitry. The input transistor includes an input, a first node, and a second node, wherein the second node of the input transistor is coupled to a supply voltage return and the input of the input transistor operably coupled to receive an outbound radio frequency (RF) signal. The output transistor includes an input, a first node, and a second node, wherein the first node of the output transistor is coupled to provide an output of the power amplifier, the second node of the output transistor is coupled to the first node of the input transistor. The circuitry is operably coupled to provide an enabling bias voltage to the input of the input transistor and to the input of the output transistor during the transmit mode and to provide a disabling bias voltage to the input of the input transistor and to the input of the output transistor during the power down mode, wherein the disabling bias voltage is of a value to distribute gate oxide stress between the input transistor and the output transistor.

6 Claims, 5 Drawing Sheets

LOW GATE OXIDE STRESS POWER AMPLIFIER

This patent application is claiming priority under 35 USC § 120 as a continuing patent application to patent application entitled POWER AMPLIFIER HAVING LOW GATE OXIDE STRESS, having a filing date of Oct. 10, 2003 and a Ser. No. 10/683,183 now U.S. Pat. No. 6,888,410.

BACKGROUND OF THE INVENTION

1. Technical Field of the Invention

This invention relates generally to wireless communication system and more particularly to power amplifiers of wireless communication devices.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier, when enabled, amplifies the RF signals prior to transmission via an antenna.

The output section of the power amplifier includes a power down P-channel transistor operably coupled to a gate of an N-channel cascode transistor, a bias circuit, and an N-channel input transistor having its gate coupled to the bias circuit and to an AC coupling capacitor to receive the RF signals. When the power amplifier is enabled, the power down P-channel transistor is on, thus enabling the N-channel cascode transistor. With the N-channel cascode transistor enabled, the N-channel input transistor amplifies the RF signals and, in conjunction with the N-channel cascode transistor, outputs the amplified RF signals.

When the power amplifier is not enabled, the power down P-channel transistor is off, which pulls the gate of the N-channel cascode transistor to ground. With a 3.3 volt supply, the gate-drain voltage and the drain-source voltage of the N-channel cascode transistor is 3.3 volts, which stresses the gate oxide layer of the transistor. Since the power amplifier is primarily in the power down mode, the gate oxide layer of the N-channel cascode transistor is stressed at 3.3 volts, which, over time, causes failures of the N-channel cascode transistor.

Therefore, a need exists for a power amplifier having low gate oxide stress.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Figure 1:
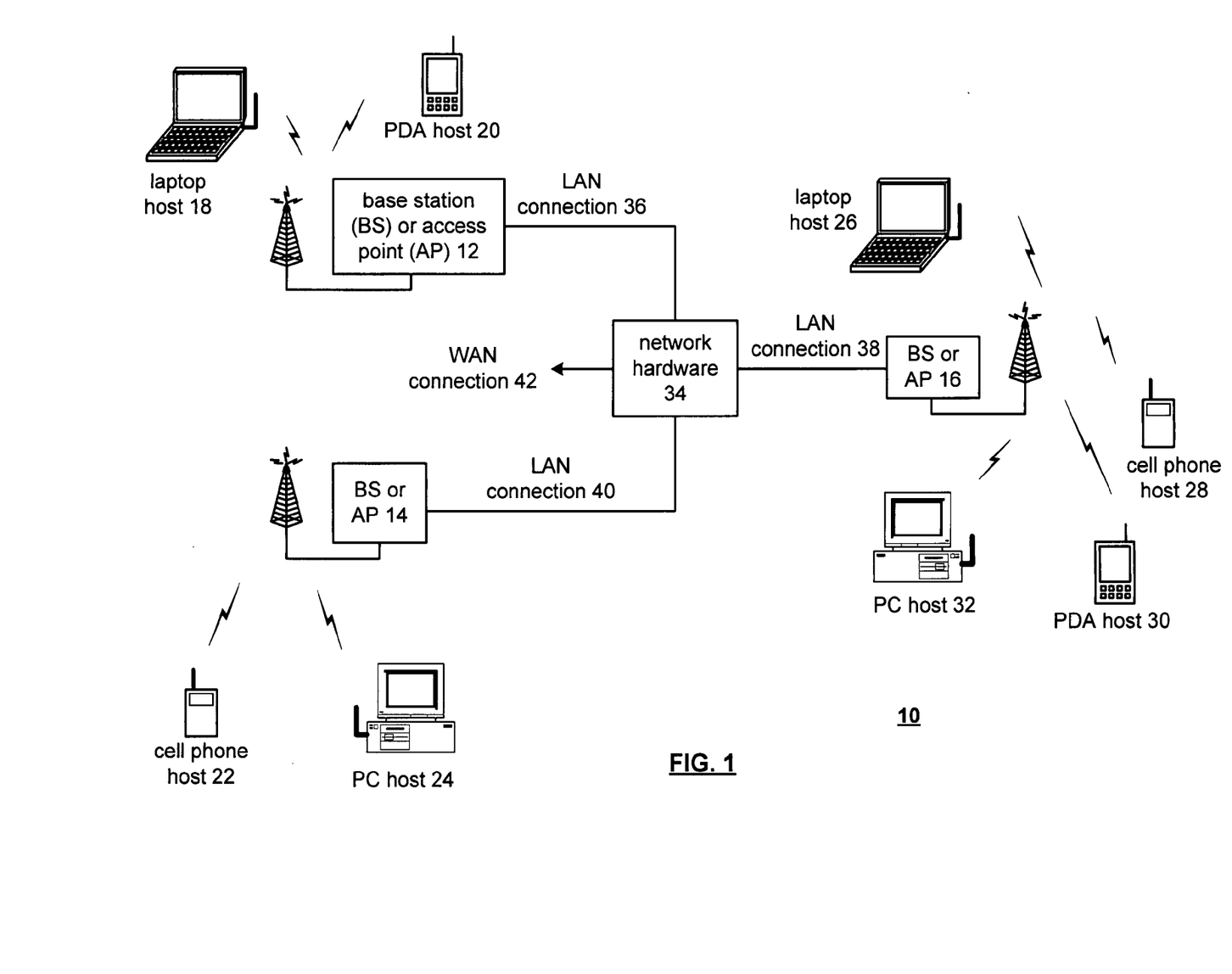
FIG. 1 is a schematic block diagram of a wireless communication system in accordance with the present invention.

FIG. 1 is a schematic block diagram illustrating a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12–16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
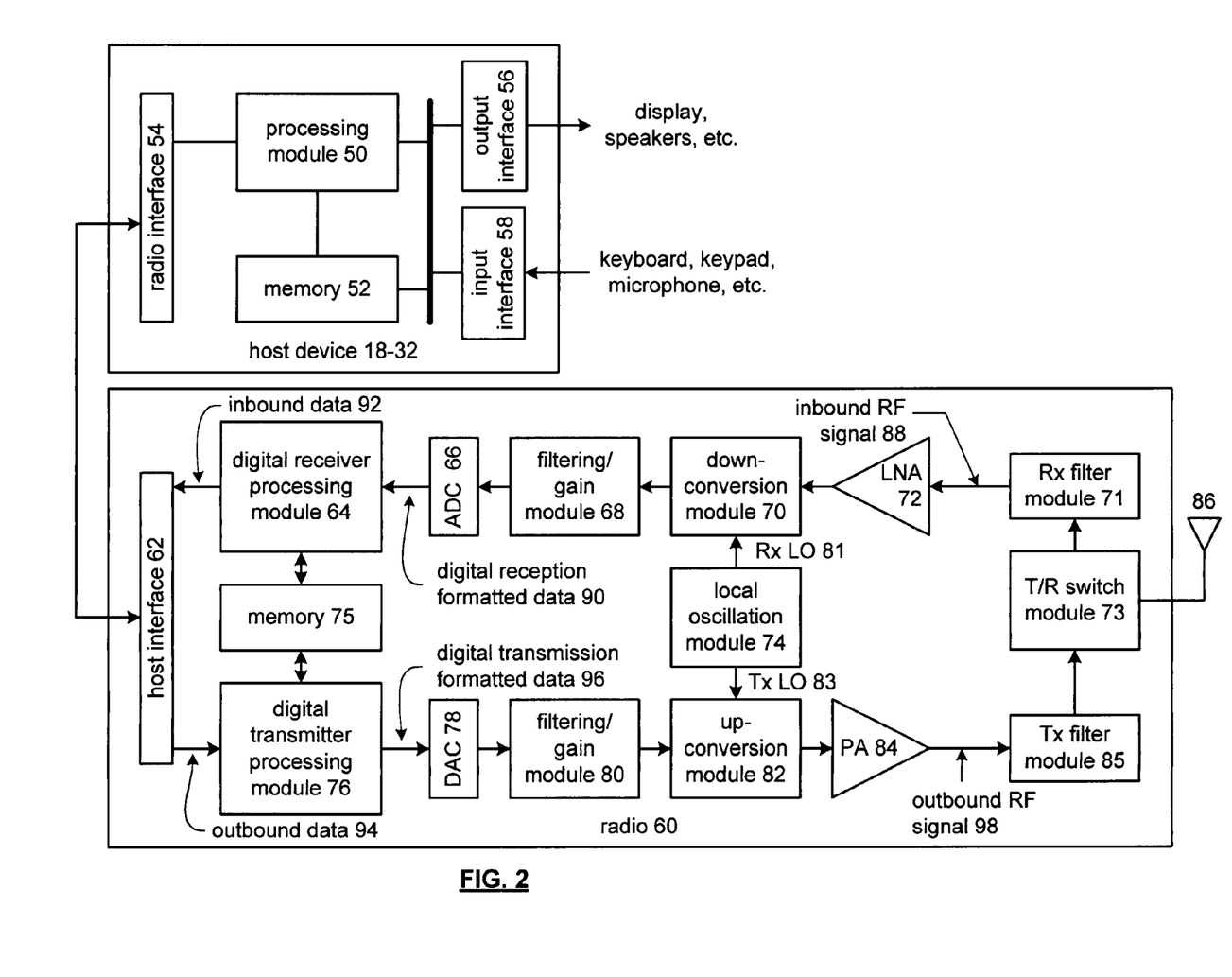
FIG. 2 is a schematic block diagram of a wireless communication device in accordance with the present invention.

FIG. 2 is a schematic block diagram illustrating a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/gain module 68, an IF mixing down conversion stage 70, a receiver filter 71, a low noise amplifier 72, a transmitter/receiver switch 73, a local oscillation module 74, memory 75, a digital transmitter processing module 76, a digital-to-analog converter 78, a filtering/gain module 80, an IF mixing up conversion stage 82, a power amplifier 84, a transmitter filter module 85, and an antenna 86. The antenna 86 may be a single antenna that is shared by the transmit and receive paths as regulated by the Tx/Rx switch 73, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11 Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 converts the analog baseband or low IF signal into an RF signal based on a transmitter local oscillation 83 provided by local oscillation module 74. The power amplifier 84 amplifies the RF signal to produce outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 73, where the Rx filter 71 bandpass filters the inbound RF signal 88. The Rx filter 71 provides the filtered RF signal to low noise amplifier 72, which amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74. The down conversion module 70 provides the inbound low IF signal or baseband signal to the filtering/gain module 68. The filtering/gain module 68 filters and/or gains the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
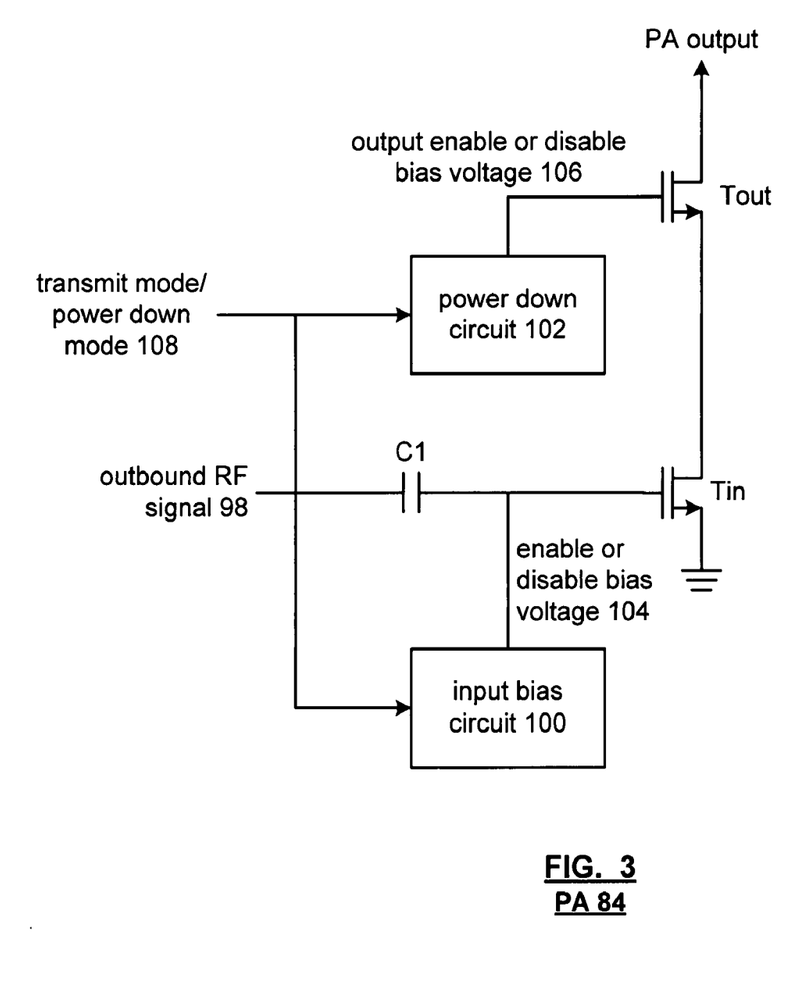
FIG. 3 is a schematic block diagram of an output stage of a power amplifier in accordance with the present invention.

FIG. 3 is a schematic block diagram of an output stage of the power amplifier 84 that includes an output transistor (Tout), a power down circuit 102, an input transistor (Tin), an input bias circuit 100, and an AC coupling capacitor C1. The power down circuit 102 and input bias voltage circuit 100 are operably coupled to receive a transmit mode/power down mode signal 108. When the transmit mode/power down mode signal 108 is in the transmit mode, the power down circuit 102 generates an enabling bias voltage 106 that approximates the supply voltage (e.g., 3.3 volts, 1.8 volts, etc.) and the input bias circuit 100 generates an enabling bias voltage 104 that is of a sufficient voltage (e.g., 0.7 volts) to place the input transistor (Tin) in an active mode. In this mode, the outbound RF signals 98 received via the AC coupling capacitor C1 are amplified and outputted via the output transistor (Tout) as the power amplifier output.

When the transmit mode/power down mode signal 108 is in the power down mode, the power down circuit 102 generates a disabling bias voltage 106 that approximates one-half of the supply voltage (e.g., 1.65 volts for 3.3 volt supply) and the input bias circuit 100 generates a disabling bias voltage 104 that approximates zero volts such that the input transistor (Tin) is off. In this state (for a 3.3 volt supply), the drain-source voltage of the input transistor (Tin) is approximately 1 volt, the gate-source voltage of the output transistor (Tout) is approximately 0.65 volts, the drain-source voltage of the output transistor (Tout) is approximately 2.3 volts, and the drain-gate voltage of the output transistor (Tout) is approximately 1.65 volts. With the transistor voltages of the power amplifier being non-rail voltages (i.e., ground and the supply voltage), for example, at mid-supply voltages, the gate oxide stress is distributed between the input transistor and the output transistor as opposed to being completely on the output transistor. Thus, by reducing the gate oxide stress, the output transistor is less likely to fail due to the stress resulting in a more robust power amplifier.

Figure 4:
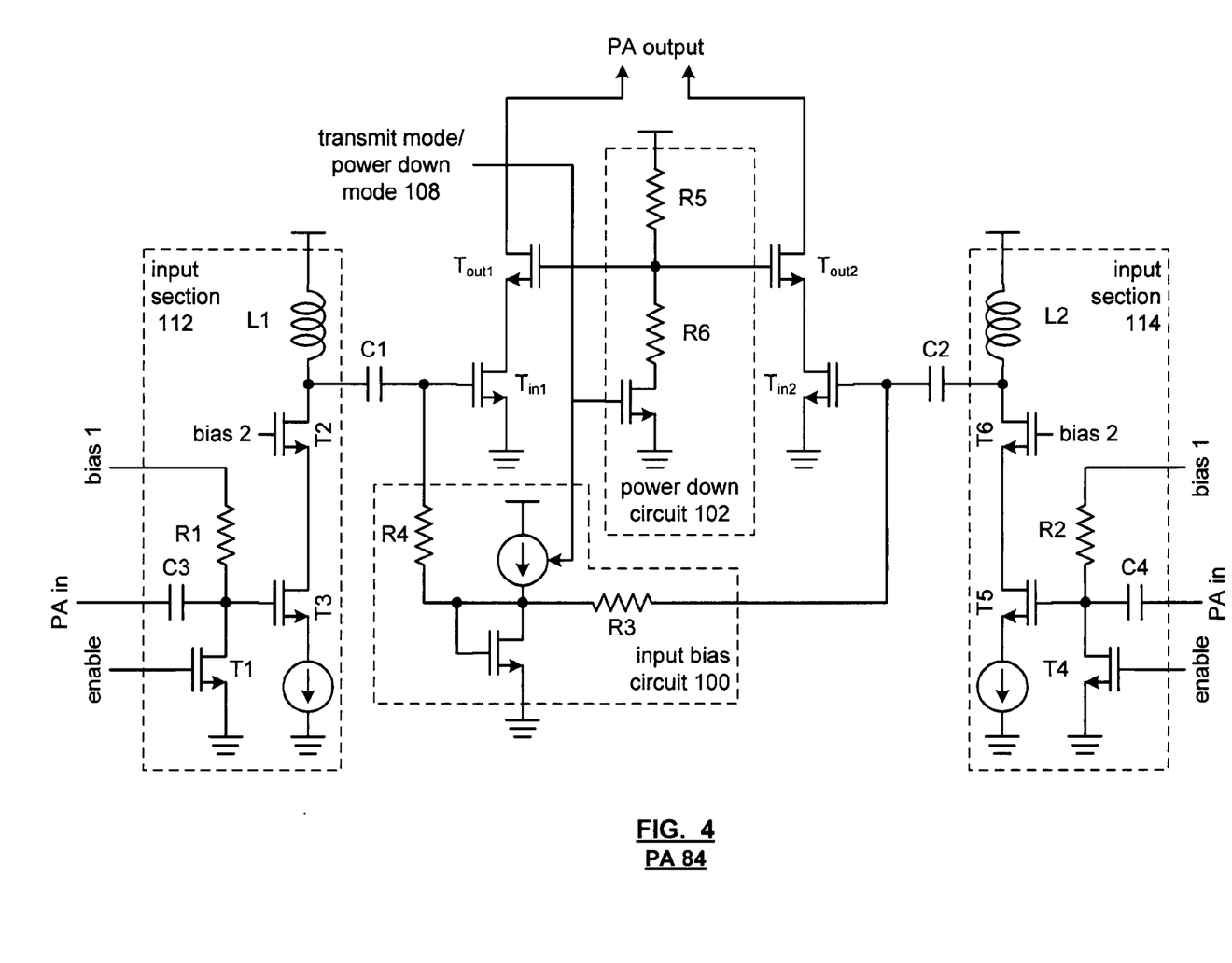
FIG. 4 is a more detailed schematic block diagram of a power amplifier in accordance with the present invention.

FIG. 4 is a more detailed schematic block diagram of a power amplifier 84 that includes two input sections 112 and 114, an input bias circuit 100, a power down circuit 102, two input transistors ($T_{in1}$ and $T_{in2}$), and two output transistors ($T_{out1}$ and $T_{out2}$). As configured, the power amplifier 84 amplifies differential RF signals, which are received at the power amplifier inputs (PA in_n and PA in_p), to produce a differential power amplifier output (PA output).

Each of the input sections 112 and 114 includes an AC coupling capacitor (C3, C4), an inductor (L1, L2), a biasing resistor (R1, R2), an enabling transistor (T1, T4), a current source, a input transistor (T3, T5), and a level adjust transistor (T2, T6). In operation, when enabled and properly biased via the first and second bias voltages (bias 1 and bias 2), the input sections 112 and 114 receive a small scale differential input signal and produce a level shifted small scale differential signal, therefrom. The level shifted small scale differential signal is provided to the differential output section of the power amplifier (i.e., capacitors C1 and C2, input transistors Tin1 and Tin2, and output transistors Tout1 and Tout2), which produces the differential power amplifier output when enabled.

The input bias circuit 100 includes an N-channel transistor, two resistors R3 and R4, and a gated current source. The gated current source is gated based on the state of the transmit mode/power down mode signal 108. When the signal 108 is in the power down mode, the gated current source is off, thus producing zero current. With zero current into the drain of the N-channel transistor, the voltage at this point is effectively zero. Thus, via resistors R3 and R4, the gates of the input transistors (Tin1 and Tin2) of the output stage are effectively held to ground, which disables the transistors. When signal 108 is in the transmit mode, the gated current source is on, thus providing a reference current to the N-channel transistor. With the gate of the N-channel transistor coupled to its drain, when the reference current is present, the N-channel transistor is enabled wherein the gate-source voltage is at a voltage above the threshold voltage of the transistor. Accordingly, via resistors R3 and R4, the gate-source voltage of the N-channel transistor is provided to the gates of the input transistors (Tin1 and Tin2) of the output stage of the power amplifier, which enables the input transistors to amplify the differential signals received via AC coupling capacitors C1 and C2.

The power down circuit 102 includes two resistors R5 and R6 and an N-channel transistor. When the transmit mode/power down mode signal 108 is in the transmit mode, the signal 108 is low, thus disabling the N-channel transistor. With the N-channel transistor off, the gate voltage of the output transistors (Tout1 and Tout2) is pull to supply voltage ($V_{DD}$) via resistor R5 such that the transistors are on to facilitate the generation of the differential power amplifier output. When the transmit mode/power down mode signal 108 is in the power down mode, the signal 108 is high, thus enabling the N-channel transistor. With the N-channel transistor on, the gate voltage of the output transistors (Tout1 and Tout2) is pull to a voltage corresponding to R5/(R5+ R6)*supply voltage ($V_{DD}$). If R5 substantially equals R6, then the gate voltage of the output transistors is approximately ½ of the supply voltage. With the transistor voltages of the power amplifier being non-rail voltages (i.e., ground and the supply voltage) during power down, for example, at mid-supply voltages, the gate oxide stress is distributed between the input transistor and the output transistor of the PA output stage as opposed to being completely on the output transistor. Thus, by reducing the gate oxide stress, the output transistor is less likely to fail due to the stress resulting in a more robust power amplifier.

Figure 5:
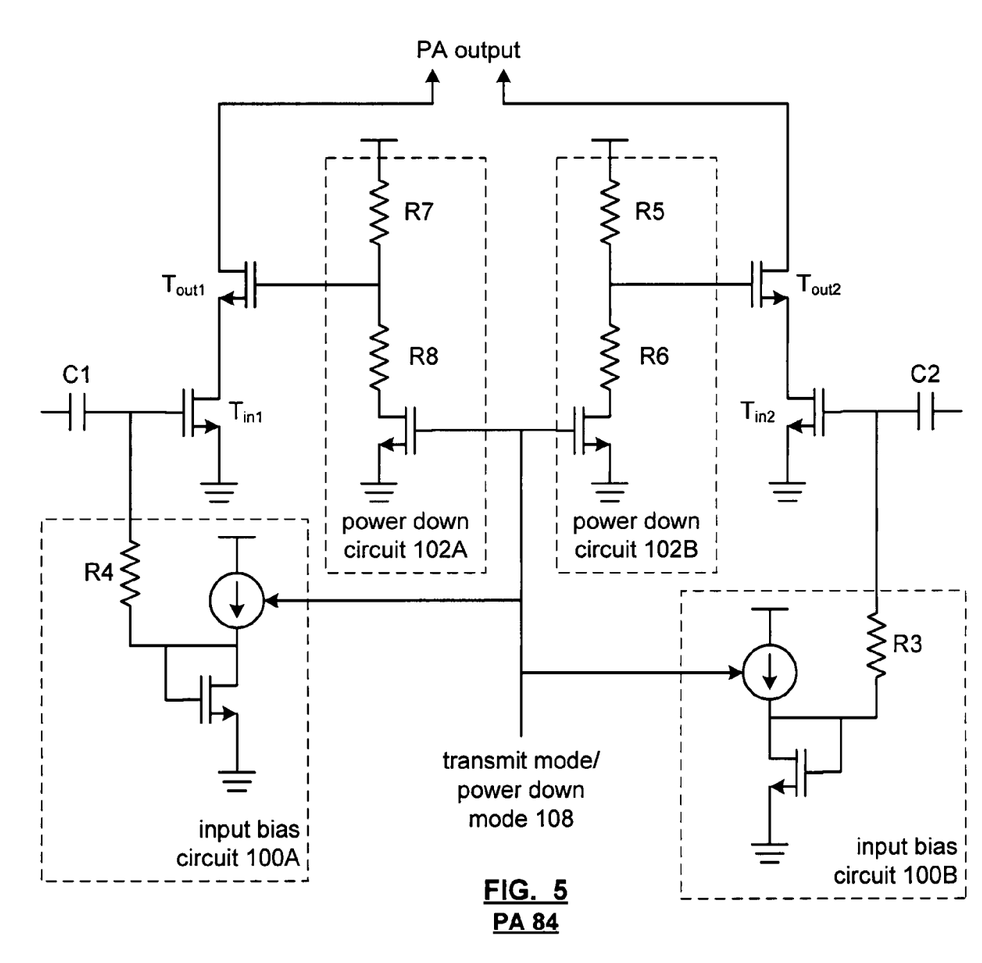
FIG. 5 is a schematic block diagram of another output stage of a power amplifier in accordance with the present invention.

FIG. 5 is a schematic block diagram of another output stage of a power amplifier 84 that includes two power down circuits 102A and 102B, two input bias circuits 100A and 100B, the AC coupling capacitors C1 and C2, the input transistors Tin1 and Tin2, and the output transistors Tout1 and Tout2. This embodiment of the output stage works similarly to the output stage illustrated and discussed with reference to FIG. 4, except, that in this embodiment, each input transistor has its own input bias circuit 100A and 100B and each output transistor has its own power down circuit 102A and 102B.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

The preceding discussion has presented a power amplifier having reduced gate oxide stress, thereby reducing potential failure of the transistors of the power amplifier. As one of average skill in the art will appreciate, other embodiments of the present invention may be derived from the teachings of the present invention without deviating from the scope of the claims.

What is claimed is:
1. A power amplifier having low gate oxide stress, the power amplifier comprises:
input transistor having an input, a first node, and a second node, wherein the second node of the input transistor is coupled to a supply voltage return and the input of the input transistor operably coupled to receive an outbound radio frequency (RF) signal;
output transistor having an input, a first node, and a second node, wherein the first node of the output transistor is coupled to provide an output of the power amplifier, the second node of the output transistor is coupled to the first node of the input transistor; and
circuitry operably coupled to provide an enabling bias voltage to the input of the input transistor and to the input of the output transistor during a transmit mode and to provide a disabling bias voltage to the input of the input transistor and to the input of the output transistor during a power down mode, wherein the disabling bias voltage is of a value to distribute gate oxide stress between the input transistor and the output transistor.
2. The power amplifier of claim 1 further comprises:
a second input transistor having an input, a first node, and a second node, wherein the second of the second input transistor is coupled to the supply voltage return and the input of the second input transistor operably coupled to receive one leg of the outbound RF signal, wherein the input of the input transistor is operably coupled to receive another leg of the outbound RF signal, wherein the outbound RF signal is a differential signal, and wherein the input of the second input transistor is operably coupled to receive the enabling bias voltage and the disabling bias voltage from the circuitry; and
a second output transistor having an input, a first node, and a second node, wherein the first node of the second output transistor is coupled to provide one leg of the output of the power amplifier, wherein the second node of the second output transistor is coupled to the first node of the second input transistor, and wherein the input of the second output transistor is operably coupled to receive the enabling bias voltage and disabling bias voltage from the circuitry.
3. The power amplifier of claim 1 further comprises:
a second input transistor having an input, a first node, and a second node, wherein the second node of the second input transistor is coupled to the supply voltage return and the input of the second input transistor is operably coupled to receive one leg of the outbound RF signal, wherein the input of the input transistor is operably coupled to receive another leg of the outbound RF signal, and wherein the outbound RF signal is a differential signal;
second output transistor having an input, a first node, and a second node, wherein the first node of the second output transistor is coupled to provide one leg of the output of the power amplifier, wherein the second of the second output transistor is coupled to the first of the second input transistor; and
second circuitry operably coupled to provide a second enabling bias voltage to the input of the second input transistor and to the input of the second output transistor during the transmit mode and to provide a second disabling bias voltage to the input of the second input transistor and to the input of the second output transistor during the power down mode.

4. The power amplifier of claim 1, wherein the circuitry comprises:
- a current source operably coupled to provide a reference current during the transmit mode and to provide zero current during the power down mode;
- a mirror transistor having an input, a first node, and a second node, wherein the second node of the mirror transistor is operably coupled to the supply voltage return, wherein the input and the first node of the mirror transistor are operably coupled to the current source to establish a voltage based on the reference current during the transmit mode; and
- a resistor operably coupling the input of the mirror transistor to the input of the input transistor to provide the voltage of the mirror transistor as the enabling bias voltage during the transmit mode.

5. The power amplifier of claim 1, wherein the circuitry comprises:
- a first resistor having a first node and second node, wherein the first node of the first resistor is coupled to a power supply voltage;
- a second resistor having a first node and a second node, wherein the first node of the second resistor is coupled to the second node of the first resistor and coupled to the input of the output transistor; and
- a power down transistor having an input, a first node, and a second node, wherein the second node of the power down transistor is operably coupled to the power supply return, the first node of the power down transistor is coupled to the second node of the second transistor, and the input of the power down transistor is operably coupled to receive a power up/power down signal.

6. The power amplifier of claim 1 further comprises:
- an input section operably coupled to provide the outbound RF signal to the input of the input transistor, wherein the input section includes:
  - an inductor having a first node and a second node, wherein the first node of the inductor is coupled to a power supply voltage;
  - a first transistor having an input, a first node, and a second node, wherein the first node of the first transistor is operably coupled to the second node of the inductor, wherein the input of the first transistor is coupled to a bias voltage;
  - AC coupling capacitor operably coupled to the first node of the first transistor and the input of the input transistor;
  - a second transistor having an input, a first node, and a second node, wherein the first node of the second transistor is operably coupled to the second node of the first transistor, wherein the input of the second transistor is operably coupled to receive a transmit RF signal; and
- a current source operably coupled to the second node of the second transistor and to the power supply return.

* * * * *